United States Patent [19]

George

[11] Patent Number: 4,556,839
[45] Date of Patent: Dec. 3, 1985

[54] ELECTRICAL CIRCUIT IDENTIFICATION MEANS

[76] Inventor: David L. George, 352 Great Quarter Rd., Sandy Hook, Conn. 06482

[21] Appl. No.: 594,064

[22] Filed: Mar. 28, 1984

[51] Int. Cl.$^4$ ............................................. G01R 19/00
[52] U.S. Cl. ........................................................ 324/66
[58] Field of Search ................................... 324/66, 67; 179/175.3 A

[56] References Cited

U.S. PATENT DOCUMENTS 4,121,152 10/1978 Hale et al. .............................. 324/66

FOREIGN PATENT DOCUMENTS 0804773 1/1969 Canada ................................... 324/66

Primary Examiner—Stanley T. Krawczewicz
Attorney, Agent, or Firm—H. Gibner Lehmann; K. Gibner Lehmann

[57] ABSTRACT

An electrical circuit identification means for identifying a particular circuit while the latter is normally energized and functioning, said means being usable with a plurality of energized circuits leading to different remote locations in an electrical installation such as a building structure or other facility, where the circuits originate at an energy distribution network that has fuses, circuit breakers or the like adapted to render the circuits dead or unenergized. A portable electrical load device is provided, to be applied to a designated circuit at the remote location where it is to be worked on, said device including a circuit controller or interrupter activated and powered by current from the circuit, so as to periodically interrupt or vary the current passing through the load and thereby cause electrical pulses or surges therein. At the central distribution center, a clip-on meter or other inductive pick-up device is magnetically linked onto the leads of the various circuits that are present, until it shows a reading of the current variations which are being generated by the remote applied load and its controller. The circuit showing such variations is the desired circuit, and can then be disconnected by removing the fuse or opening the breaker, as the case may be.

19 Claims, 16 Drawing Figures

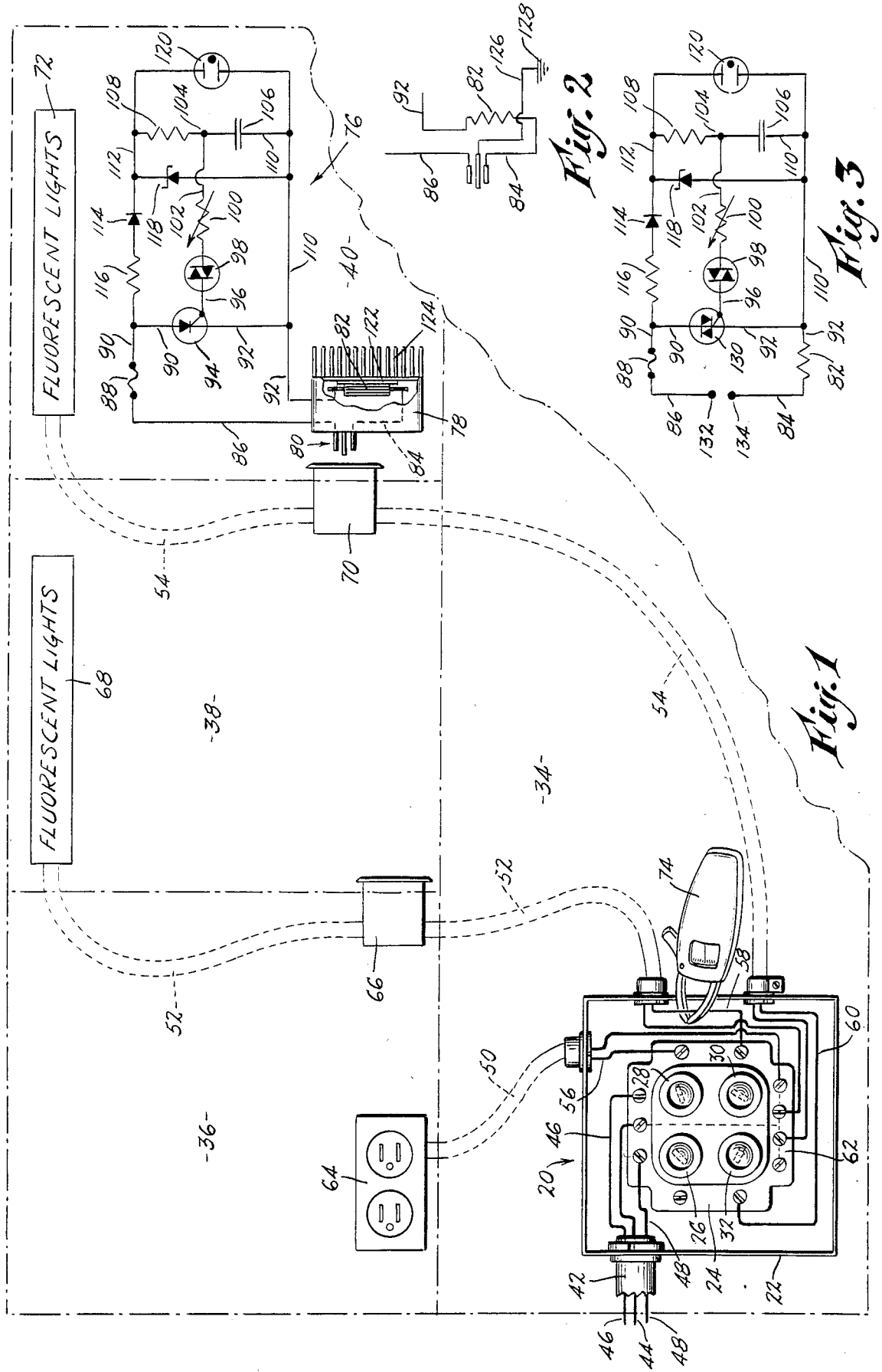

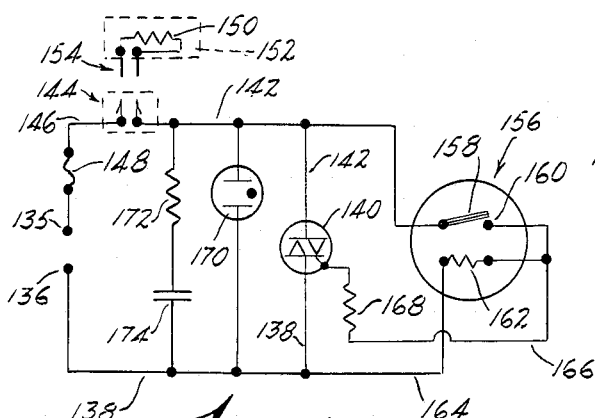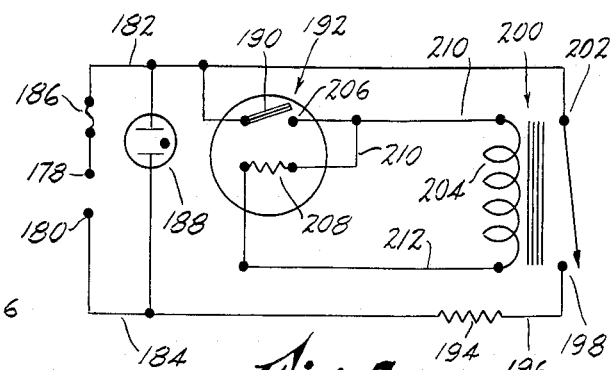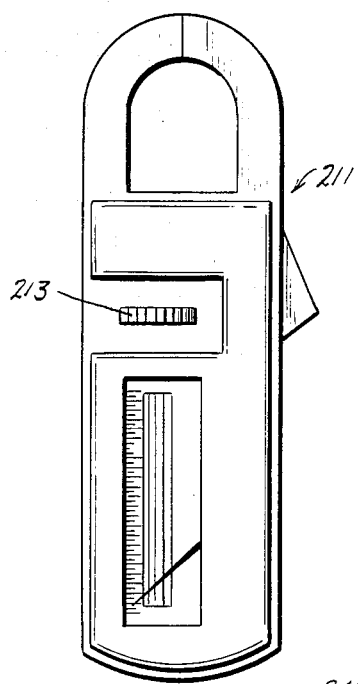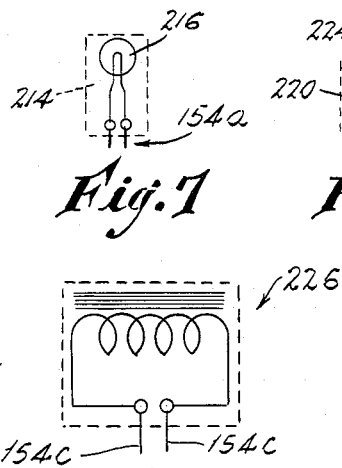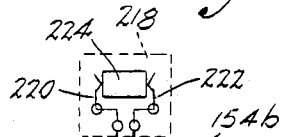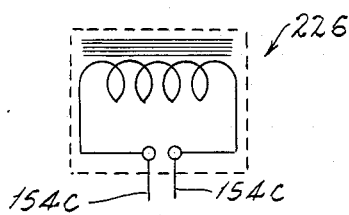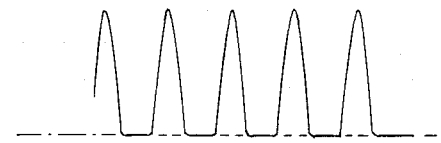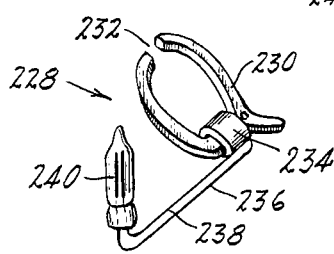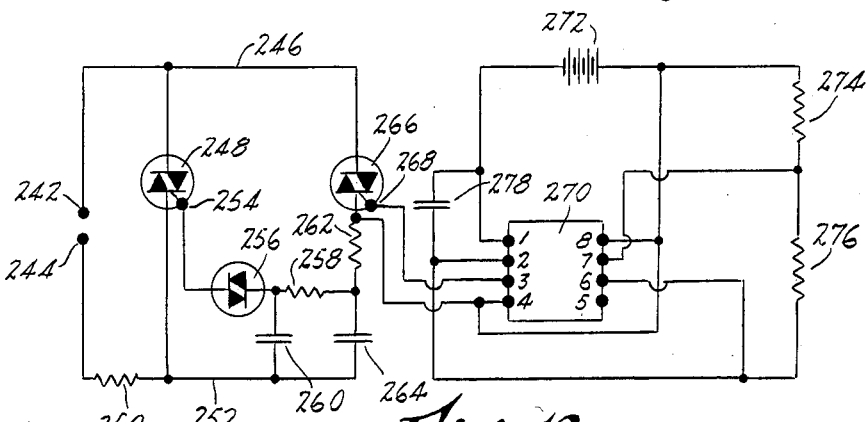

ELECTRICAL CIRCUIT IDENTIFICATION MEANS

BACKGROUND

This invention relates to devices intended to identify one of a plurality of electrical circuits at a facility, and more particularly to devices of this type which will enable a single worker having access to a distribution center or network to accurately identify and de-energize one of a number of circuits thereat which have extensive inaccessible portions that extend to different remote but accessible locations in the facility, all without requiring the services of an assistant.

In the past various devices and methods have been employed to enable circuits to be identified when visual means cannot be used, or are inconvenient. Three U.S. patents directed to this purpose are U.S. Pat. Nos. 3,076,931; 3,623,142; and 3,924,179, all of which are more or less complicated and moreover do not lend themselves to the specific purpose of the present invention.

In U.S. Pat. No. 3,076,931 the remote ends of a cable being monitored are connected together, and a pulse generator and rotary switch is employed to create different pulses in different lines, which are then discriminated by an inductive pick-up coil so as to identify the desired leads. This arrangement presupposes that the lines in question are not already energized, but instead safe to be worked on and connected to, and that no existing energy of the lines is to be used to generate or effect the pulses.

U.S. Pat. No. 3,623,142 reveals a motor-operated cam that actuates a switch for applying power, through a lamp, to a test lead that is intended to be connected to the questionable lines, one at a time. The remote ends of all the lines to be tested must be grounded so that a pulse can be caused by the switch as it is operated by the cam. Thus, the lines cannot be energized conventionally and tested while carrying power, but instead special "dead" conditions must be established before the testing can be done.

U. S. Pat. No. 3,924,179 proposes using a jumper across the remote ends of a conductor pair, while a pulse is applied to the near end and detected by a clip-on meter. Here, again, the testing cannot be done while the lines are carrying the usual energization, but instead the lines must first be disconnected from all the conventional energy sources prior to the testing.

It has also been proposed to apply a modulated Gaussian noise signal to a line, such as a telephone line, whereby testing can be carried out that is inaudible to persons communicating over the line because the waveforms will only be detected by special receiving equipment.

In connection with electronic instruments such as circuit boards, a test device using a probe has been utilized. The test device has a speaker which emits signals of different tones when the probe is touched to different test points on the board, such tones corresponding to digital "1"s or "0"s, and in some cases comprising alternating high and low pitch sounds.

Other test procedures involve two stations that are respectively connected temporarily to a field unit and an office or central unit, and that communicate with each other electronically to match the corresponding ends of multi-conductor cables which can be of considerable length.

So far as I am aware, no system has been proposed which can, in a simple manner, identify at a central distribution network or point, any of a plurality of live or energized cables that terminate at a remote point, utilizing a pulsing or circuit control device energized from the existing available current in the cables and without requiring the services of additional personnel.

The prior existing or proposed devices were all intended for other purposes, and were never adapted to attain the objectives of the present invention, as well as being more complicated and costly in their constructions.

SUMMARY

The above drawbacks and disadvantages of prior circuit identification devices are obviated by the present invention, which has for one object the provision of an improved electrical circuit identification means and method, operable with a plurality of branch circuits leading from an energy distribution network or point to different remote locations in a facility or machine, whereby a single predetermined circuit can be reliably identified and de-energized without de-energizing the entire system and without requiring more than a single person or worker to carry out such function, thereby to enable such branch to be disconnected or rendered "dead" as by the pulling of its fuse or breaker.

Another object of the invention is to provide an improved circuit identification and disconnection means and method as above, which is especially simple and wherein the means is inexpensive in its construction.

Still another object of the invention is to provide an improved circuit identification and disconnection means in accordance with the foregoing, which is reliable in its operation and of sturdy construction whereby it can withstand considerable usage and rough handling without malfunctioning.

Yet another object of the invention is to provide an improved circuit identification means and method as set forth above, which can be utilized by relatively unskilled personnel, with accurate and precise results.

A still further object of the invention is to provide an improved circuit identification means as characterized, which is especially small and compact, and light in weight.

Still another object of the invention is to provide an improved circuit identification means as above set forth, which is substantially completely powered by the circuits being tested, and which is intended to be employed on circuits which are in their normal, "live", operative state or condition.

In carrying out the above objects the invention provides, essentially, a portable electrical load such as a resistor, for example, which is adapted to be applied to a predetermined branch circuit at its remote location, in conjunction with a circuit control or interrupter that is activated and powered by the existing current from said circuit so as to periodically interrupt or vary the current passing through the load and cause electrical current pulses or surges to exist in the circuit. At the energy distribution network or center, a clip-on meter or other inductively-linked indicator is applied to the various leads, one at a time, of the various circuits that are accessible to the workman, until the device shows a reading of the surges which are being generated by the remotely-applied load and its controller. The circuit showing such surges, being the desired circuit, can then be disconnected by removing its fuse or by opening its breaker, as the case may be. The invention embraces the use of various types of circuit controllers or interrupters, such as magnetic flashers and relays, solid state interrupters and timers, as well as various types of resistors including positive temperature coefficient resistive components, resistive components associated with heat sinks, incandescent (lamp) bulbs, etc.

The electrical load and its circuit controller or interrupter can be physically very small, embodying solid state circuitry, with few components of inexpensive character; the unit can include a visual or audible indicator, and fusing to insure its safety in use.

The method of the invention involves the identification of any one of a plurality of electrical circuits that lead to different remote locations in an electrical installation and which originate at an energy distribution network which has means for opening the hot lead of any one of the circuits to thereby render the same dead. The method includes the steps of connecting an electrical load to a predetermined one of the circuits at the remote location in the network, simultaneously while normal power is being applied to the circuits, periodically interrupting or varying the current to the connected load, applying an inductively-coupled indicator sequentially to the hot leads of the plurality of circuits at the distribution network, and opening the circuit of that one lead which causes the inductively-coupled indicator to read pulses or surges corresponding to the interruptions of or variations in energy to the load, thereby deenergizing the circuit so located and thus permitting repairs or other work to be performed without danger of shock to personnel that are in contact therewith, such as might occur during installation of wiring, additions to existing circuits, installation of switches, etc. The arrangement is such that all of the steps can be quickly and easily performed by single person, as opposed to previous arrangements where it was required that an electrician and his helper occupy different rooms, for example, and verbally communicate to each other, one party being at the fuse panel and the other at the remote location of the circuit where the latter was to be deenergized.

In addition to the feature noted above wherein the load can be connected to the desired circuit while it is still in a "live" condition, the present invention has another significant and highly desirable characteristic in that it is functional whether or not there is existing current flowing in the "live" circuit, and its proper operation is not at all dependent on the magnitude of such current. For example, if the suspect circuit has one or more lamps or appliances which are drawing current, the pulses or fluctuations in current produced by the load will constitute an additive reading, that is, they will merely be summed into the existing appliance or lamp load; under such circumstances, the reading obtained on the indicator will show a steady state value of current corresponding to that total drawn by the lamps, appliances, etc., in use, with the variations or surges appearing as fluctuations (increases) in the steady state reading. Thus the circuit can be identified in the same manner as set forth above, irrespective of existing currents from loads that are already in place and operative in the circuit being tested. There is thus no need to disconnect such appliances or other equipment prior to testing by use of the apparatus and method of the invention.

Other features and advantages will hereinafter appear.

In the accompanying drawings, illustrating several embodiments of the invention:

FIG. 1 is a diagrammatic showing of an electrical circuit installation having multiple branches, in conjunction with the circuit identification means of the invention.

FIG. 2 is a fragmentary schematic circuit diagram, depicting a portion of the circuitry of FIG. 1 in a more conventional manner.

FIG. 3 is a schematic circuit diagram of a portion of a somewhat modified circuit identification means, constituting another embodiment thereof.

FIG. 4 is a schematic circuit diagram of a portion of a further modified circuit identification means, constituting still another embodiment thereof.

FIG. 5 is a schematic circuit diagram of a portion of a still further modified circuit identification means, constituting yet an additional embodiment of the invention.

FIG. 6 is a plan view of a clip-on meter of the type which can be employed in carrying out the invention.

FIG. 7 is a fragmentary diagrammatic showing which depicts an alternative type of load for use with the indicator means of the invention.

FIG. 8 is a fragmentary diagrammatic showing which depicts another alternative type of load for use with the indicator means of the invention.

FIG. 9 is a graphic representation of the voltage or current waveform which appears across the load resistor in the circuit of FIG. 1, with the circuit identification means in use.

FIG. 10 is a fragmentary diagrammatic showing which depicts another alternative type of load for use with the indicator means of the invention.

FIG. 11 is a perspective view of an alternate type of inductive pick-up device which may be substituted for the clip-on meter shown in FIG. 6, the alternate device employing a magnetic core having a separable gap that is capable of being installed over one of the leads of a circuit, a multi-turn coil, and a neon-type light monitor connected to the coil and adapted to provide visible flashes or indications when pulses or surges are received from the coil.

FIG. 12 is a schematic circuit diagram of a portion of a modified circuit identification means of the invention, illustrating still another embodiment thereof.

Figure 13:
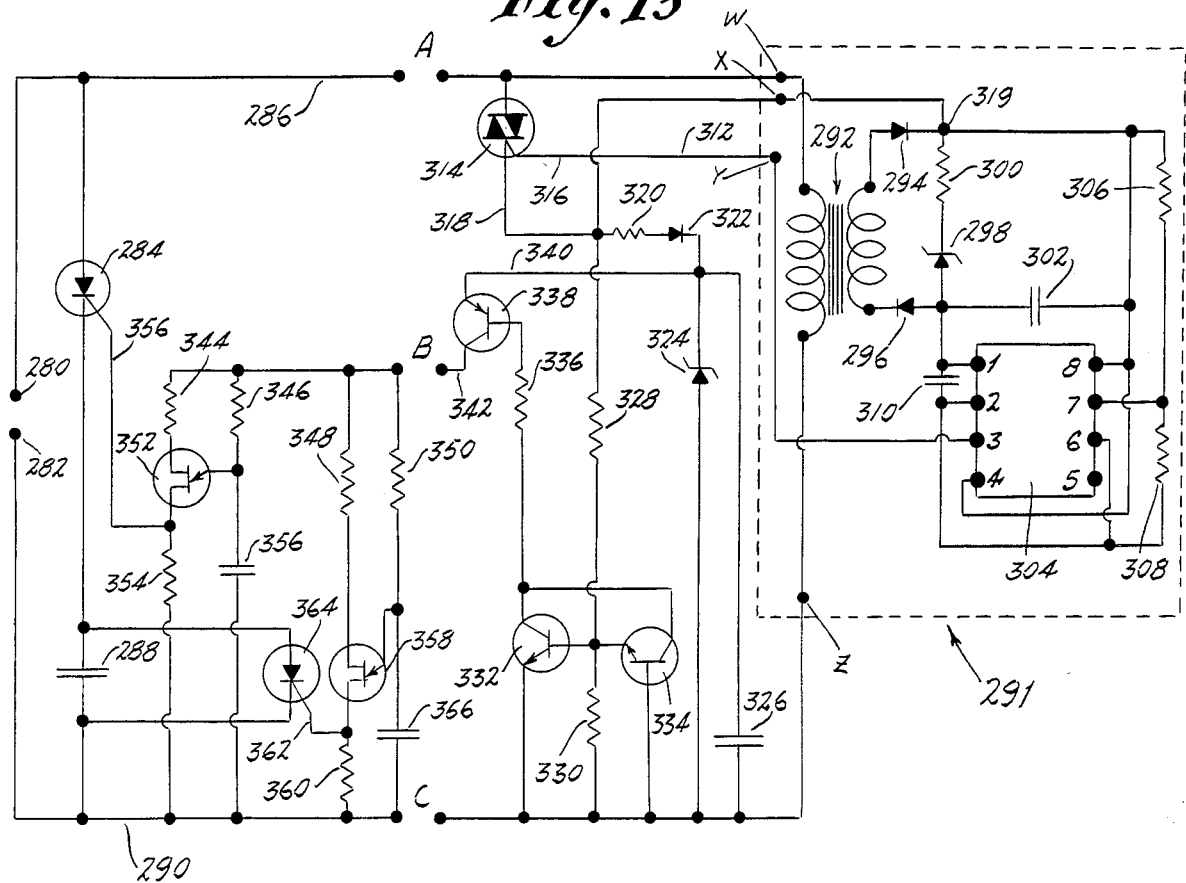

FIG. 13 is a schematic circuit diagram of a portion of a modification of the circuit identification means of the invention, having terminal pairs indicated by the letters A, B, and C, adapted to be connected to one another, constituting yet another embodiment.

Figure 14:
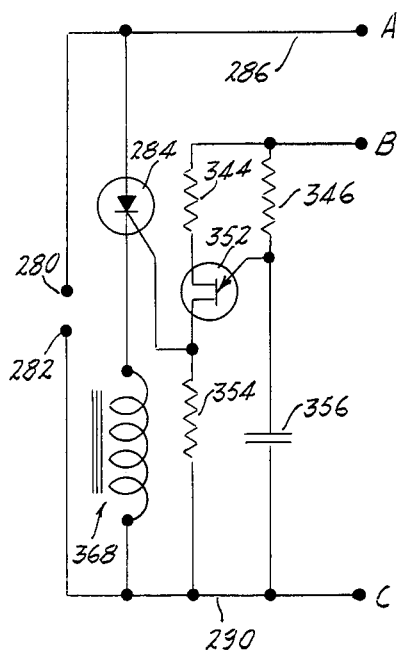

FIG. 14 is a schematic circuit diagram of a portion of a further modification of the circuit identification means of the invention, constituting still another embodiment thereof. The terminals A, B, and C are adapted to be connected to those similarly labelled terminals and the circuitry disposed to the right thereof in the diagram of FIG. 13.

Figure 15:
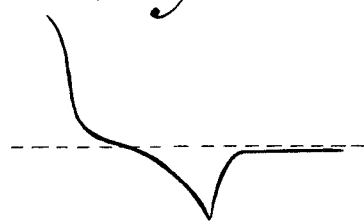

FIG. 15 is a graph of a typical waveform which appears across an inductive load during the time when the control element of the circuit identification means of FIG. 14 is rendered electrically conductive. The dotted line indicates the zero crossover point of the A.C. voltage or waveform.

Figure 16:
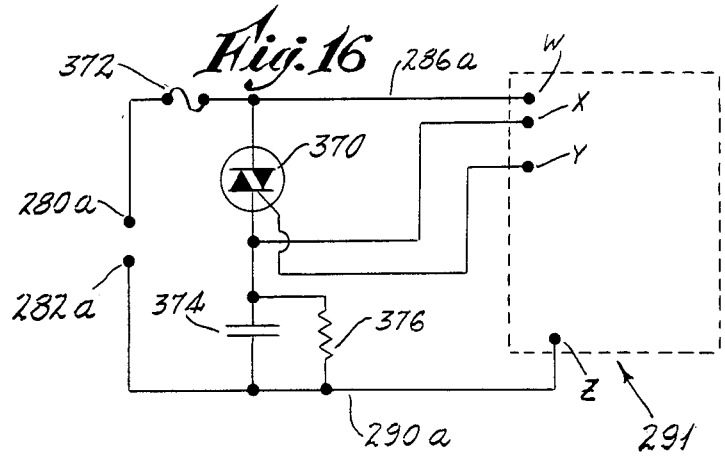

FIG. 16 is a schematic circuit diagram of a portion of a further modification of the circuit identification means of the invention, constituting still another embodiment thereof. The terminals W, X, Y and Z are adapted to be connected to those similarly labelled terminals and the circuitry disposed within the dotted outline in FIG. 13.

Referring first to FIGS. 1 and 2, the circuit identification means of the present invention is illustrated in connection with a wired facility which could be a factory structure, private dwelling, public building or other facility which is served by commercially available electrical power. Such facility could have a central electrical energy distribution means or network, designated generally in FIG. 1 by the numeral 20 and shown as a fuse box 22 comprising a housing in which there is mounted a fuse block 24 having four fuses 26, 28, 30 and 32. The fuse box 22 could be located in the basement area of the building, for example, such area being indicated by the numeral 34. The wired facility or structure is shown as including rooms or areas 36, 38 and 40 which have accessible termination points that could be remote from, or else not immediately accessible to, a worker who is to test the circuits in the fuse box 22.

As is common practice, the fuse box 22 can have an inlet conduit 42 bringing into the box a three wire, 220 volt center ground cable having the ground lead 44 and "hot" or energized leads 46 and 48. These three leads are secured to terminals on the fuse block 24 as shown. The lead 48 supplies the two fuses 26 and 32, whereas the lead 46 supplies the two fuses 28 and 30. The fuse block has terminal screws connected respectively with each of the fuses, in the well-known manner.

Leading from the fuse box 22 are three branch cables, designated 50, 52 and 54 respectively, having "hot" or energized leads 56, 58 and 60 under the control of the fuses 28, 30 and 32. The remaining leads of the branch cables 50, 52 and 54 are the ground return leads, all connected to the common ground bus or terminal strip 62 in the box 22.

The cable 50 is shown as supplying electrical energy to the room or area 36, by virtue of being connected to an outlet box or accessible circuit termination point 64. The cable 52 supplies energy to the room 38 by connection to an outlet box 66 and a fluorescent lighting fixture 68. The cable 54 supplies energy to the room 40 by its connection to an outlet box or termination point 70 and a fluorescent light fixture 72.

In accordance with the present invention, an improved and simplified means and method are provided which will enable a single workman to reliably identify any of the cables 50, 52 or 54 from the location of the fuse box 22, without benefit of a circuit plan or layout of the facility, and for the purpose of rendering such cable "dead" or de-energized in order to safely perform any needed operations thereon. The said means comprises a usual type of clip-on meter 74 for use at the central distribution point or fuse box 22, in conjunction with variable electrical loading means generally designated by the numeral 76, which is adapted to be connected with an outlet at the remote location in question, receiving substantially 100% of its energy from the conventional, existing power which the cable is carrying to said location.

The electrical loading means 76 can comprise different forms, as revealed herein. In FIGS. 1 and 2, such means comprises a small casing 78 having a three-prong grounding type plug connector 80 which can be plugged into any of the receptacles of the outlet boxes 64, 66 or 70, to receive energy therefrom. Within the casing 78 there is provided an electrical load component in the form of a low-value heat-dissipating resistor 82 that is connected by a wire 84 with one of the energy-carrying prongs of the plug 80, as shown. The other of the energy-carrying prongs of the plug 80 is connected by a wire 86 with a fuse 88 depicted in a schematic circuit diagram in the figure. It will be understood, however, that all of the components of the schematic circuit diagram are of small size and can be totally housed in the casing 78 of the unit.

From the fuse 88 and loading resistor 82, leads 90 and 92 are brought to an SCR device 94 having a gate or trigger connected by a lead 96 to a diac 98 that is connected through a resistor 100 and lead 102 to the common junction 104 of an RC timing device comprising a capacitor 106 and a resistor 108. The capacitor 106 is connected by a lead 110 to the lead 92, and the resistor 108 is connected by a lead 112 to a diode 114 which connects, through a resistor 116, to the lead 90. A Zener diode 118 is connected to the leads 110 and 112, as protection for the capacitor 106, which may have a voltage rating less than the peak value of the A.C. from box 70. Visual indication or signal means are provided by the invention, in the form of a neon lamp 120 connected to the leads 110 and 112, such lamp giving an indication as to the energization of the pulsing-type loading unit when it is plugged into the outlet box 70, for example.

The loading resistor 82 is shown schematically in FIG. 2. It can be of the type provided with a heat-dissipating jacket 122, such jacket being mounted in good heat-dissipating relation to a finned heat sink 124. In FIG. 2 the center, grounding prong of the plug 80 is shown as connected by a lead 126 to a ground connection 128 which can be a portion of the casing 78.

Operation of the indicator means of the invention can now be readily understood. The clip-on meter 74 in FIG. 1 is shown as being clipped over or around the "hot" lead of the cable 52, whereby no circuit identification is being given, this being seen by a non-pulsing or steady state of the needle of the meter occasioned by the load represented by the fluorescent lights 68. However, when the meter 74 is clipped over the hot lead 60 of the cable 54 with the unit 76 plugged into the outlet box 70, it will give a positive indication by a swinging movement of its needle, in time with the pulses generated in the cable by the interrupter-type load represented by the unit 76. Marked oscillation of the meter needle will be observed, thereby to identify the circuit that is energizing the unit 76. The fuse 32 can then be pulled out, so as to de-energize the circuit and render it safe to work on. The repetition rate of the pulses can be one or two per second, or possibly other suitable rates which would lead to readily visible, relatively slow deflections of the needle of the meter 74.

The functioning of the interrupted-load circuit of FIG. 1 is as follows: With energy supplied to the leads 90 and 92 (through resistor 82) from the outlet box 70, a timed charging of the capacitor 106 of the RC timer circuit will occur, through the lead 86, fuse 88, resistor 116, diode 114, lead 112 and resistor 108 on the one hand, and through the lead 84, resistor 82, and leads 92 and 110 on the other hand. Upon the voltage across the capacitor 106 reaching a certain predetermined value, which could be an interval spanning a number of cycles of the A.C. supply, as at presently understood the voltage reaching the diac 98 through the resistor 100 will cause conduction of the diac, thereby applying a voltage to the lead 96 of the gate of the SCR 94. This will cause the SCR 94 to conduct, thereby energizing the loading resistor 82 through the fuse 88. This energization is momentary and it could comprise a clipped portion of one or more wave shapes (half waves) of the A.C. supply, starting at a predetermined voltage value and ending when the said wave shapes pass through zero once, or after several cycles, according the present understanding of the invention. Such energization effects a discharge of the timing capacitor 106 and opening of the circuit by virtue of quick discontinuance of conduction of the SCR 94. The timing action through the capacitor 106 now repeats, and after the desired interval, which could be one or several seconds depending on circuit values, the momentary energization of the loading resistor 82 is again repeated. The net result is a pulsed current in the cable 54, which will be manifested by a corresponding swinging of the needle of the clipon meter when the latter is clipped over the "hot" lead 60 of the cable 54. It is noted that such swinging movement of the pointer or needle of the meter will occur irrespective of whether the fluorescent lights 72 are on or off. For example, if they are on, the meter will indicate a steady state current corresponding to that drawn by the lights between the occurrence of the pulses. If, however, they are off the meter will read "zero" between the pulses generated by the device 76.

Values which have been found satisfactory, for the circuit components of FIG. 1 are as follows: The loading resistor 82 can have a value of about one ohm. The resistor 100 can have a value of about 200 ohms and resistor 116 can be 1500 ohms. The resistor 108 can be 100K ohms, and the capacitor 106 can be 50 mfd. The SCR 94 can be that sold commercially under type No. SK 3572, manufactured by RCA. The diac 98 can be a type SK 9120, also manufactured by RCA. The Zener diode 118 can be type No. SK 39. The neon light 120 can be conventional, and diode 114 can also be of a conventional type, having a voltage rating of several hundred volts, and a current rating of 1 amp or so. Fuse 88 is preferably a 5 amp slow-blow type.

Another embodiment of the invention is illustrated in FIG. 3. The circuitry here is mostly the same as in FIGS. 1 and 2, except that in the place of the SCR 94 of FIG. 1 there is substituted a triac 130 that is connected to the leads 90, 92 and 96. Because of the similarity of the circuits, the remaining components have all been given the same numerals. The operation of the circuit of FIG. 3 is generally similar to that of FIG. 1 except that both wave halves of the A.C. current from the outlet box 70 are available for the energization of the loading resistor 82. The terminals 132, 134 in FIG. 3 can connect with the conductor prongs of the plug 80 of the unit 76, as will be understood. Resistor 108 and capacitor 106 in FIG. 3 can optionally have alternate values of 30K ohms and 470 mfd., with satisfactory results.

Still another embodiment of the invention is illustrated in FIG. 4 wherein a heat-responsive flasher is utilized to effect the interruption of the circuit to the loading resistor. Also, an external type of loading resistor is provided, exterior to the casing for the unit, resulting in several advantages over a unit that is completely integrated. As shown, the supply terminals are designated 135, 136 and the latter is connected by a lead 138 to a triac 140 which is in turn connected by a lead 142 to a receptacle 144 on the unit. The receptacle 144 is connected by a lead 146 to a fuse 148 which connects with the terminal 135. The external load resistor 150 is contained in its own casing 152, indicated by the dotted outline, and connects to prongs 154 adapted to be received in the receptacle 144.

Connected to the leads 138 and 142 is a heat-responsive flasher 156 which can be of the type having a bimetallic switch arm 158 and cooperable contact 160 constituting make-and-break contacts, and a heater element 162 connected by a lead 164 to the lead 138. The other end of the heater element 162 is connected to a lead 166 which connects with the contact 160 and also with a resistor 168 that is joined to the gate of the triac 140. A neon indicator lamp 170 is connected to the leads 138 and 142, and a series-connected resistor 172 and capacitor 174 are bridged across the leads 138 and 142. The circuit operates as follows: When the unit is plugged into a live receptacle or outlet box so as to provide a 115 volt A.C. voltage across the terminals 135, 136, the bimetallic switch arm 158, in being normally closed, provides a voltage to the gate of the triac 140 which renders the latter conducting. This energizes the load resistor 150, causing a current pulse in the cable being tested. At the same time, the heater 162 in the flasher is energized and warms up, causing the bimetallic arm 158 to flex and leave the contact 160. This in turn deprives the gate of the triac 140 of sustaining voltage, and the triac opens the circuit as the A.C. passes through zero in the wave form. The heater 162 now cools off, and as the bimetallic arm again flexes and touches the contact, the cycle is repeated. Thus, a pulsing current is caused to flow in the cable under consideration, and this current will be detected by a swinging needle when the clip-on meter is clipped over the hot lead of the cable. The load 150 and casing 152 could be constituted as a conventional space heater, having a rating of from several hundred watts to over 1000 watts. Such units are readily available from a wide variety of sources.

Yet another embodiment of the invention is illustrated in FIG. 5, wherein a heat-responsive flasher is coupled to an electrical relay to effect the intermittent energization of the loading resistor. In this figure, the supply terminals 178 and 180 are connected to leads 182 and 184, the lead 182 containing the fuse 186. A neon indicator lamp 188 is connected across the leads 182 and 184, and the leads are respectively connected to the bimetallic arm 190 of a flasher 192 and to a loading resistor 194 which latter is connected by a lead 196 to one contact 198 of an electrical relay 200. The other relay contact 202 connects with the lead 182. The relay coil 204 connects with the flasher contact 206, and the heater 208 of the flasher is bridged across the coil 204 by leads 210 and 212. The deflections of the bimetallic arm 190 in responding to heat and no-heat conditions of the heater 208 effect an energization and de-energization of the relay coil 204, resulting in closing and opening of the relay contacts 198 and 202 and energization and de-energization of the loading resistor 194. With the arrangements of FIGS. 4 and 5, the clicking of the flashers or relays will give an audible indication when the circuit is "live", and the neon bulbs 170, 188 will provide a visual indication.

FIG. 6 depicts a type of clip-on meter 211 which can be set for a number of different scales and sensitivities by means of an adjustment or switching wheel 213. Thus, where circuit conditions might require more sensitivity in the response of the meter needle, this can be achieved by merely resetting the wheel 213 to the most responsive scale or reading.

FIG. 7 shows an alternative type of load resistor which can be used in the indicator means of the invention. This resistor, designated by the numeral 214, could be substituted for the resistor unit 152 in FIG. 4, for example, as a plug-in accessory. Or, it could be used as an integrated component in the circuits of FIGS. 1 and 3 by providing a large enough casing to include its main component, which is an incandescent lamp.

The unit 214 comprises a pair of prongs 154a which are adapted to be received in the receptacle 144 of FIG. 4. Connected with the prongs is an incandescent lamp bulb 216, to be energized thereby. The bulb 216 can be a 300-watt size, which typically has a cold resistance of 7 ohms and a hot resistance of 48 ohms. Thus, the bulb 216 can be considered as a type of positive temperature coefficient (PTC) resistance which causes a large initial surge of current when first connected or energized, such current falling off rapidly immediately upon the incandescent state being attained whereby the total power represented by any one surge is relatively small. Therefore, the heat dissipation required of the unit 214 is low, compared with a unit using an ordinary resistor which does not have an appreciable PTC characteristic.

Another alternative type of loading resistor unit is illustrated in FIG. 8, being designated by the numeral 218. This unit has prongs 154b which are receivable in the receptacle 144, such prongs being connected to spring clips 220, 222 which are adapted to receive and make contact with a PTC cartridge resistor 224 of ceramic make-up. The cartridge 224 can be readily replaced if it malfunctions, this same being true of the lamp bulb 216. In addition, the lamp bulb 216 gives a visual indication of operation of the indicator means, since it flashes on and off when energy is supplied, as by plugging the indicator means into a live receptacle.

The use of a PTC resistor as the loading resistor has the advantage that the heat which must be dissipated by the unit is much less than otherwise. Thus a safety factor is realized by the use of such resistors.

In connection with safety, it is noted that in the disclosed arrangements, there is provided a fuse in the interrupted load unit, preferably of the slow-blow type, and having a rating such that if the interrupter (SCR or triac) circuitry fails in the manner of a short circuit, the steady state current which could conceivably flow through the load would cause the fuse to blow, rather than giving rise to excessive heating of the load. As an example, with the circuit of FIG. 1, if the SCR were to become permanently shorted, with a resistor 82 of one ohm, a steady state current of tens of amperes could conceivably flow for a short interval, until the fuse blew. If the rating of the fuse were, for example, 5 amperes, it would protect the unit from overheating. During normal operation, however, the length of time during which current is flowing is so short, that the slow blow fuse does not "see" the very short, high magnitude pulses that are produced, and thus the device maintains its conduction properties.

In FIG. 3, the triac can be type No. SK 3938.

In FIG. 4, the resistor 172 can be 100 ohms, and the capacitor can be 0.1 mfd. The triac 140 can be type No. SK 3938. The heat responsive flasher 156 can be Amperite No. 115F30. The load 150 can be such that it would draw between 250 and 1000 watts, if permanently connected to a 115 volt supply. In FIG. 5, the relay can be a Line Electric Type MK01A, having a coil rating of 115 VAC. The load 194 is similar to load 150 in FIG. 4 as far as rating is concerned. In FIG. 7, the lamp 216 can be a 115 volt, 300 watt rating. In FIG. 8, the ceramic PTC resistor can have a nominal value of one ohm at room temperature.

Yet another type of load is illustrated in FIG. 10, being designated 226 and comprising a choke coil having an iron or ferrite core. The unit has prongs 154c which are receivable in the receptacle 144 of FIG. 4. Alternately, the coil could be incorporated in a unit similar to that designated 76 in FIG. 1 so as to constitute a compact, unitary assemblage. A value of 6 millihenries has been found to be satisfactory for the choke 226.

FIG. 9 shows a graph of a typical voltage or current waveform appearing across one of the loads, such as resistor 82 in FIG. 1, for example. The horizontal axis represents time, and the vertical axis represents the voltage across the load. Depending on the values of the timing components 108 and 106 in FIG. 1, and the voltage rating of the diac 98, the SCR 94 can be made to conduct over one or several half cycles. In FIG. 9, a total conduction of about 4 cycles of a 60 cycle sinusoidal wave is shown, at which time the D.C. voltage on capacitor 106 falls below the level required to maintain conduction of the SCR 94 through the diac 98, and the SCR ceases to conduct after its other terminals experience the next excursion through zero voltage. I have found that a satisfactory operating condition occurs where the SCR conducts for several half cycles, and then remains off for a period of between 2 and 10 seconds. The longer that the SCR remains off, the less power dissipation occurs in the load resistor 82, which may be desirable for safety considerations.

FIG. 11 illustrates another type of clip-on indicator which can be substituted for that shown in FIG. 6. The unit is designated by the numeral 228, and comprises a pivotally joined two-part core 230 having a separable gap 232 which can be placed around a lead such as that designated 58 in FIG. 1, and further contains a multi-turn coil 234 having leads 236 and 238 extending therefrom, to a monitor 240, which is preferably a neon bulb. In use, the core 230 is slipped over the leads, one at a time, and an observance of periodic flashing on the bulb 240 made, indicating the lead that is being pulsed. This particular arrangement has the advantage that extremely short periods of pulsing can be employed, to keep the power that is dissipated in the load 82 to an absolute minimum. With the arrangement employing the meter of FIG. 6 in the circuit of FIG. 1, the pulse width or pulse train has to be sufficiently long to enable the inertia of the needle to be overcome. That is, if the pulse is too short, inadequate flickering of the needle on the clip-on meters of FIGS. 1 or 6 may result.

In FIG. 11, when the core 230 is clipped over a lead, the latter in effect becomes a single convolution or turn of a transformer primary, with the secondary comprising the multi-turn coil 234. If the coil 234 has a sufficient number of turns, a large induced voltage will occur in the coil 234, sufficient to cause the desired momentary flashing of the bulb 240.

With reference to FIG. 1, the method of the invention includes the steps of connecting, at a remote point, such as 40, an electrical load such as 82 to a predetermined one, 54 for example, of a plurality of circuits 50, 52 or 54, some or all of which extend remotely from a central distribution point, as box 22, in a building structure or other facility, periodically interrupting or varying the current, by switching the SCR 94 on and off, to said connected load at said remote point, applying a clip-on meter 74 sequentially to the hot leads of said plurality of circuits at said central distribution point, and opening the circuit of that one lead which has caused the clip-on meter to read pulses or variations corresponding to the interruptions of or variations in energy to said load.

Another embodiment of the invention is shown in FIG. 12. In this figure, the supply terminals are indicated by the numerals 242 and 244. The terminal 242 extends via a lead 246 to a triac 248, and the terminal 244 extends through a load 250 to a line 252, also connected to the triac 248. The gate 254 of the triac 248 extends to a diac 256, whose other lead is connected to the junction of a resistor 258 and capacitor 260, the other lead of the capacitor being joined to line 252. The resistor 258 is in turn connected to the junction of a second resistor 262 and a capacitor 264. The other lead of capacitor 264 is connected to line 252.

The resistor 262 is joined to one terminal of a second triac 266, having its other terminal connected with the line 246. The gate 268 of this second triac is connected to terminal #3 of an integrated circuit 270 that operates as an astable multivibrator. The integrated circuit 270 is powered by a small battery 272, and has associated with it frequency determining components comprising resistors 274, 276 and capacitor 278. As shown, power from the battery is applied to terminals #1 and the juncture of terminals #4 and #8.

In operation, the integrated circuit 270 generates a square wave on terminal #3, applying it to the gate 268 of triac 266. During one half of the square wave cycle, the triac 266 is gated into conduction, such that the voltage from line 246 is applied to the upper end of the resistor 262. This causes current to flow in the resistor 262, charging capacitor 264 slowly; simultaneously, current flows through resistor 258 and begins to charge capacitor 260. When the charge on capacitor 260 increases sufficiently, the diac 256 conducts, firing the triac 248 and causing a pulse of current to flow through the load resistor 250. Typically the charge on capacitor 260 remains sufficient for the triac 248 to remain conducting over several cycles such that a waveform similar to that of FIG. 9 would be generated, except that several cycles of a full sine wave would occur across the load. The gate current of triac 248 causes a discharging of capacitor 260 (and capacitor 264), and the triac becomes non-conducting the next time that the voltage across it passes through zero. The circuit thus produces short bursts of 60 cycle current, separated by considerably longer intervals during which no current flows. This process continues as long as the one half cycle of the square wave exists, that is, as long as the triac 266 remains conducting. During the other half cycle of the square wave, the triacs 266 and 248 both remain off, and no current flows through load 250, allowing it time to cool. The frequency of the square wave is on the order of 1 Hz or so, but the exact figure is not critical. The network comprising resistors 258 and 262, and capacitors 260 and 264 constitutes a phase shift network, which is driven through the triac 266, by the integrated circuit 270.

The circuit values and component types which have been found to provide satisfactory performance in the arrangement of FIG. 12 are as follows: The triac 248 can be a type SK 3938, and triac 266 can be type SK 5555, both manufactured by RCA. The integrated circuit is what is known as a "555 timer", RCA type SK 3564. The battery 272 has a 9 volt rating. Resistors 274 and 276 are 100K ohms and 6.2 megohms, respectively; all the capacitors are 0.1 mfd. Resistors 250, 258 and 262 are 1 ohm, 120K ohms, and 1.8K ohms, respectively. The diac 256 is a type SK 9120, rated at 30 volts.

Still another embodiment of the invention is shown in FIG. 13. The input terminals forming part of a supply control circuit intended for connection to the plug connector 80, are designated 280 and 282, these being connected with supply and output control circuitry as more fully described hereinafter. A solid state control means is provided, including a device in the form of an SCR 284 has one terminal connected to line 286, and its other terminal connected through a load in the form of a large value capacitor 288 to the line 290 thereby to effect a control of the energization of such load. In this circuit, the terminal pairs adjacent the letters A, B, and C are intended to be permanently connected to one another. Connected to the supply control circuit of FIG. 13, comprising the lines 286 and 290 is a coupling means comprising a coupling or isolation step-down transformer 292 having a secondary winding extending to rectifiers 294 and 296, a Zener regulator diode 298 and limiter resistor 300. Capacitor 302 filters the output from the rectifiers, and provides a D.C. supply voltage to a signal generator in the form of an integrated circuit multivibrator 304 having terminals 1, 8 for receiving energization, and having terminals 3, 8 for putting out a signal, this being similar to that of the embodiment of FIG. 2. Associated with the multivibrator are timing components comprising resistors 306, 308 and capacitor 310. As in the previous arrangement, the output of the multivibrator is a square wave, of roughly 0.5–1.0 Hz. The terminals 1, 8 of the signal generator 304 receive energization from the supply control circuit which includes the lines 286 and 290.

The output terminal #3 of the integrated circuit 304 is connected via a line 312 to the gate of a solid state device in the form of a triac 314. The terminals 3, 8 of the signal generator 304 put out a characteristic signal, and are adapted for connection with an output control circuit which includes, with other circuitry now to be described below, the solid state control means having the triac 314. The upper terminal of triac 314 is connected, through the bridged terminal pair A, to line 286, while the lower terminal extends, via line 318, to a junction 319. The junction 319 connects with the cathode of diode 294. It also extends to a resistor 320 which is in turn connected to a rectifier 322, for supplying a D.C. voltage to a zero crossing detector, to be described below. The D.C. is regulated by a Zener diode 324, and filtered by capacitor 326. The zero crossing detector comprises transistors 332 and 334, a resistor 328 which extends between the junction of the base of transistor 332 and emitter of transistor 334 to line 318, which carries A.C. voltage when the triac 314 is rendered conductive. The collectors of transistors 332 and 334 are joined, extending to a resistor 336, which in turn supplies drive to the base of a switching transistor 338. The emitter of transistor 338 is connected, via line 340, to the D.C. supply provided by rectifier 322, Zener 324, and capacitor 326. The collector 342 extends via line 342 to the bridged terminal pair B. The emitter of the transistor 332 and base of transistor 334 are connected to one side of the resistor 330, which in turn is connected to one side of the capacitor 326 and one side of the primary winding of the coupling means or transformer 292, and through the bridged terminals C, to line 290.

D.C. voltage is supplied through line 342, to a dual unijunction circuit. One unijunction is arranged to fire the SCR 284, while the second is arranged to fire a second SCR that is across the load capacitor 288, as will be explained below.

The bridged terminals B extend to resistors 344, 346, 348 and 350, as shown. The resistor 344 is connected to one base of the first unijunction transistor 352, whose load resistor 354 is connected to its other base. The gate of the SCR 284 is joined to the second base via line 356, and the opposite lead of resistor 354 is connected to line 290. A timing capacitor 356 extends from the triggering gate of the unijunction 352 to line 290. The second unijunction transistor has its first base connected to the resistor 348, and its second base to a resistor 360, and also via line 362 to the gate of a second SCR 364. This latter SCR is connected across the load capacitor 288. From the triggering gate of the unijunction 358 there is a timing capacitor 366 that connects to line 290.

In operation, the SCR 284 is arranged to apply a pulse derived from the A.C. sinusoidal 60 cycle current supplying terminals 280 and 282, to the capacitor 288; the value of the latter is relatively large, so that even though the pulse is short, the peak current is such that it will produce a significant deflection on a clip-on ammeter when the arrangement of FIG. 13 is connected as in FIG. 1, in order to identify or verify a particular circuit.

The circuitry comprising rectifiers 294, 296, Zener 298, resistor 300, and capacitor 302 constitute a coupled and isolated D.C. supply for the integrated circuit 304, which supply is isolated from the A.C. connections to terminals 280 and 282. That is, terminals 1 and 8 of the signal generator 304 are connected to receive D.C. supply voltage. Terminal 1 is negative with respect to terminal 8. In addition, it is seen that terminal 1 is at a different absolute voltage from that appearing on either of the lines 286 or 290, due to the provision of the isolation transformer 292. This arrangement of a negative terminal (1) of the generator 304 being essentially "floating" or isolated from the lines 286, 290 is necessary for the circuit of FIG. 13 to operate in such a way that the output (terminals 3,8) of the generator control the SCR 284 in the desired manner. On output terminal #3 of the integrated circuit there appears, continuously, a square wave which is "on" for about one second, and then "off" for about one second. When the level is at the "on" state, the triac 314 is triggered into conduction, which energizes, through line 318, the D.C. supply comprising Zener 324 and capacitor 326. At the same time that the triac 314 is triggered on, the A.C. wave on line 318 is applied through divider resistor string 328 and 330, to the transistors 332 and 334. Following a zero crossing of the wave between lines 318 and 290, the transistor 338 is gated on by transistors 332 and 334, through resistor 336. This pulls line 342 up to the Zener voltage, line 340, which begins operation of the two timing circuits represented by the unijunctions 352 and 358. The time constant of the resistor-capacitor combination 346, 356 is less than that of resistor-capacitor 350, 366. At the beginning of the timing interval, the capacitor 356 begins to charge (from zero) until the unijunction 352 fires, rendering the SCR 284 conductive through line 356, and supplying a charging current to capacitor 288. The values of the resistor 346 and capacitor 356 are selected so that after the unijunction begins its timing interval at a zero crossover point, it fires within a period just less than the next zero crossover point, for example, around 170° or 175° following the initial zero crossover. Thus, the SCR conducts for 10° or less until the SCR is turned off when the next zero crossing occurs. Since capacitor 288 is of large value, and since it is initially discharged, the pulse over this 10° interval is large enough to produce a noticeable deflection on the clip on ammeter being employed.

The second unijunction 358 is arranged to trigger the SCR 364 after the SCR 284 has ceased conduction. This action is accomplished by selecting the proper values for the timing resistor 350 and capacitor 366. With SCR 284 off, SCR 364 eventually fires, rendering SCR 364 conductive through gate line 362, thereby discharging the capacitor 288 fully, and readying it for the next conductive phase of SCR 284. The action involving charge and discharge of capacitor 288 continues each cycle until the integrated circuit 304 removes drive from triac 314. Then no current flows through SCR 284 until the next (one second later) "on" level appears on terminal #3 of the integrated circuit 304. In some of the appended claims the integrated circuit 304 and associated components are referred to as a signal generator or signal generator means; similarly the unijunction circuits are also referred to by these terms.

Another embodiment of the invention is shown in FIG. 14, wherein the circuit thereof is adapted to be substituted for that portion of the circuit of FIG. 13 which is to the left of the terminals A, B, and C. Again, following substitution, the terminal pairs A, B, and C are intended to be electrically connected together, or bridged to one another.

The operation of the modified circuit of FIG. 14 is similar to that of FIG. 13, with the exception that in place of the capacitor load 288 of FIG. 13, an inductive load 368 has been substituted. The remaining components are the same, and accordingly they have been given correspondingly similar numbers. Since the load is inductive, there is no need to provide a second unijunction (358 in FIG. 13) to periodically discharge a capacitor, and accordingly, that unijunction and its associated timing and load components, as well as the SCR 364, are not required in the simplified circuit of FIG. 14.

FIG. 15 is a representation of an actual waveform appearing across the inductor 368. The horizontal axis represents time, and the vertical axis, the voltage across the inductor. The plot was obtained from an oscilloscope. The left edge of the wave represents the point at which the SCR 284 has just fired, perhaps 10° or so prior to the zero crossing of the wave applied to terminals 280 and 282. As soon as the zero point is reached, the SCR 284 switches off, since it will conduct in one direction only. The part of the wave extending below the dotted line, which represents zero volts, is believed to be an induced voltage resulting from the abrupt interruption of current flowing through the inductive load.

Component values and/or part numbers for the circuit of FIG. 13 which have been found to provide satisfactory operation are as follows: Integrated circuit 304 is a "555 timer", available from RCA, No. SK 3564. Capacitor 302 is 250 mfd. Resistor 300 is 30 ohms. Resistors 306 and 308 are 100K ohms, and 6.2 megohms, respectively, and capacitor 310 is 0.1 mfd. Zener diode 98 is a 12 volt unit, and rectifiers 294 and 296 can be conventional silicon types. The transformer 292 is a 115 volt primary, 12 volt secondary type, also of conventional construction, readily commercially available.

The triac 314 can be a type SK 3665, by RCA. Resistor 320 can be 3300 ohms, and rectifier 322 can be a general purpose silicon type. Zener diode 324 is 12 volt type. Capacitor 326 can be 220 mfd. Transistors 332 and 334 are each NPN type, No. SK 3124. Transistor 338 is a PNP type, No. SK 3841. Resistors 336, 328 and 330 are respectively, 22K ohms, 100K ohms, and 12K ohms.

Unijunction transistors 352 and 358 can both be type SK 9122. Capacitors 366 and 356 are both 0.1 mfd. Resistors 344 and 348 are both 120 ohms. Resistors 354 and 360 are both 100 ohms. Resistors 346 and 350 are respectively 430K ohms and 1 megohm. The SCR 284 and SCR 364 are both type SK 3574, and the capacitor 288 is 2200 mfd., preferably rated at 35 volts or more.

In FIG. 14 the inductor can be an iron core type, having an internal resistance of 0.1 ohm, and an inductance of 6 millihenries.

The circuits shown in FIGS. 12, 13 and 14 thus produce relatively short pulses in the load by delaying the firing of a thyristor, following a zero crossing of the A.C. wave, by an interval of time which is just less than that corresponding to one half of a 60 cycle signal, and thereafter firing the thyristor for a short interval until the next zero crossing is reached. For example, the first half cycle of the wave can be thought of as a 180° portion of the full 360° cycle. The circuits operate in such a way that no current flows for the first 170°, for example, because there is no drive for the gate of the thyristor device; thereafter, following the application of drive voltage to the gate, by means of either a unijunction (FIGS. 13, 14) or a diac (FIG. 12), current then flows for the remaining 10° until the wave crosses zero, and the thyristor ceases to conduct. The circuit of FIG. 12 employs a triac to accomplish the switching, whereas in the arrangements of FIGS. 13 and 14, an SCR is used.

Yet another embodiment of the invention is shown in FIG. 16. The input terminals are designated 280a and 282a. The portion of the circuit indicated in dotted outline and designated 291 constitutes a duplicate of the correspondingly numbered portion of FIG. 13. As was previously described, this circuit comprises a power supply which provides D.C. voltage for the integrated circuit multivibrator 304. In the circuit of FIG. 16, the terminals W, X, Y and Z are adapted to be connected to the correspondingly designated terminals of the portion of the circuit of FIG. 13 which appears in dotted outline. Terminals W and Z supply A.C. voltage to the primary of the transformer 292, and terminals X and Y are connected to a Triac 370, which may be similar to that indicated 248 in FIG. 12. A fuse 372 is in series with one of the A.C. lines 286a, and the other line is indicated 290a. In series with the Triac 370 is a load comprising a capacitor 374 and resistor 376. I have found that a nonpolarized capacitor having a value of 400 mfd., at a voltage rating of 125 volts A.C. provides satisfactory results in this circuit. The resistor 376 can have a value of 2200 ohms, 2 watts.

In operation, the integrated circuit multivibrator 304 of FIG. 13 periodically gates the Triac 370 on and off, at a rate of one cycle every few seconds. As presently understood, this latter circuit of FIG. 16 is quite unique in that it provides a surprisingly high pulse load, on the order of 5-10 amperes, but does not generate significant heat. When the Triac is fully conducting, the voltage across it is low, typically less than a volt, and even though the current is substantial, the power dissipation is maintained within tolerable limits. The Triac is typically conducting less than half the time, this factor contributing to low heat dissipation in both this device and the capacitor. In this connection it is noted that the capacitor 374 exhibits only a slight warming after a sustained period of operation, and thus many of the problems of the prior circuits, involving the generation of excessive heat, have been completely eliminated by the present arrangement. It is believed that the non-polarized capacitor charges on each half cycle, and on the opposite half cycle returns most of the energy it absorbed on the first half cycle, as opposed to dissipating this energy in the form of heat, as was the case in the prior circuits.

The fuse 372 can be a slow-blow type, and provides protection in the event of an inadvertent short-circuiting of either the Triac or the capacitor.

It should be understood that the above values and component types are considered to be exemplary, and not limiting. It is likely that other types and values could be substituted for those listed, with substantially similar results being achieved.

The general class to which SCR and triac semiconductor devices belong is known as thyristors. In some of the appended claims, this latter term has been employed, and it is intended that where such a word is utilized, it indicates either type of device.

In addition, the term solid state device, while including the above terms, does not preclude the use of transistors in some or all of the circuits described above, as switching elements for the load, or for other functions, as for example, timers or signal generators of various types.

It will now be seen from the foregoing that I have provided a unique means and method of identifying, requiring but a single workman, any one of a plurality of electrical circuits leading to different remote locations in a building structure or other facility and originating at a central distribution point which has means for opening the hot lead of such circuit to render the same dead, said means and method utilizing the existing energization in the cables. The devices as illustrated herein are simple and inexpensive, small and compact, and especially reliable in their operation. They can be utilized by relatively unskilled personnel, and do not require the learning of complicated or difficult-to-master procedures.

While several of the disclosed arrangements operate by strictly "interrupting" the load current periodically, that is, establishing periods of zero current flow through the load, it is to be understood that the invention is applicable to situations where a strict "interruption" is not required. Instead, as can be readily appreciated, a mere "variation" in current drawn by the load would produce useful indications on a device such as the clip-on meter shown in FIG. 6, and accordingly the intent of the wording incorporated in the application should be construed as reflecting this possibility involving variation in load current, as opposed to complete interruption thereof.

Variations and modifications are possible without departing from the spirit of the invention.

Each and every one of the appended claims defines an aspect of the invention which is separate and distinct from all others, and accordingly each claim is intended to be treated in this manner when examined in the light of the prior art, in any determination of novelty or validity.

What is claimed is:

1. A wholly self-contained electrical signalling means for energization by and for the purpose of distinguishing a particular one of a plurality of normally energized electric circuits leading to different accessible termination points in an electrical installation and originating at an energy distribution network that has means for opening said plurality of circuits and rendering the same dead, said circuits being normally energized and functioning, and said signalling means comprising, in combination:

(a) an electrical load,
(b) connection means for connecting said load to an accessible circuit termination point of one of said electric circuits, which termination point is disposed remote from said distribution network, said termination point being part of a predetermined one of said circuits that is to be identified at said network, and said connection means providing current to said load from said predetermined one circuit,
(c) a circuit control means activated and powered by current from said predetermined circuit, for periodically varying the current passing through said load, thereby to cause electrical current surges to flow in the predetermined circuit, and
(d) an inductively-coupled indicator adapted to be magnetically linked to any of the leads of said plurality of electrical circuits at the said distribution network,
(e) said indicator being adapted to respond to the surges in said predetermined circuit and to give an indication thereof, when magnetically coupled to the lead of said predetermined circuit at the distribution network,
(f) a housing carrying and enclosing said electrical load, said housing having a heat dissipating face,
(g) said housing containing a heat sink disposed at said heat-dissipating face and in thermal exchanging relation with the electrical load, so as to dissipate heat generated therefrom,
(h) said circuit control means being disposed substantially completely within said housing so as to minimize the possibility of fire, or shock or burn hazard to personnel handling the equipment.

2. Electrical circuit identification means for locating a particular one of a plurality of electrically-energized circuits leading to different accessible termination points in an electrical installation and originating at an energy distribution network that has means for opening said plurality of circuits and rendering the same dead, said circuits being normally energized and functioning, said means comprising, in combination:

(a) an electrical load,
(b) means for connecting said load to an accessible circuit termination point which is disposed remote from said distribution network, said termination point being part of a predetermined one of said circuits that is to be identified at said network, and said means providing current to said load from said predetermined one circuit,
(c) a circuit control means activated and powered by current from said predetermined circuit, for periodically varying the current passing through said load, thereby to cause electrical current surges to flow in the predetermined circuit, and
(d) an inductively-coupled indicator adapted to be magnetically linked to any of the leads of said plurality of electrical circuits at the said distribution network,
(e) said indicator being adapted to respond to the surges in said predetermined circuit and to give an indication thereof, when magnetically coupled to the lead of said predetermined circuit at the distribution network,
(f) said electrical circuits carrying A.C. sinusoidal current characterized by consecutive cycles,
(g) said circuit control means comprising a signal generator,
(h) a phase shift network,
(i) a solid state device having a control terminal, said solid state device being connected with the said load in order to vary the current therethrough, and
(j) means connecting said phase shift network between the signal generator and the solid state device such that output energy from the generator is delayed in reaching the solid state device, thereby to reduce the conduction time of the latter to a relatively small number of consecutive cycles of the A.C. current.

3. The invention as defined in claim 2, wherein:
(a) said phase shift connecting means comprises a thyristor,
(b) said phase shift network comprising two RC networks, connected in tandem, and adapted to drive the control terminal of the said solid state device.

4. Electrical circuit identification means for locating a particular one of a plurality of electrically-energized circuits leading to different accessible termination points in an electrical installation, and originating at an energy distribution network that has means for opening said plurality of circuits and rendering the same dead, said circuits being normally energized and functioning, said means comprising, in combination:

(a) an electrical load,
(b) means for connecting said load to an accessible circuit termination point which is disposed remote from said distribution network, said termination point being part of a predetermined one of said circuits that is to be identified at said network, and said means providing current to said load from said predetermined one circuit,
(c) a circuit control means activated and powered by current from said predetermined circuit, for periodically varying the current passing through said load, thereby to cause electrical current surges to flow in the predetermined circuit, and
(d) an inductively-coupled indicator adapted to be magnetically linked to any of the leads of said plurality of electrical circuits at the said distribution network,
(e) said indicator being adapted to respond to the surges in said predetermined circuit and to give an indication thereof, when magnetically coupled to the lead of said predetermined circuit at the distribution network,
(f) said electrical circuits carrying A.C. sinusoidal current, characterized by consecutive cycles,
(g) said circuit control means comprising a signal generator means,
(h) a solid state device having a control terminal, said solid state device being connected with the load in order to vary the current therethrough,
(i) a second signal generator means for producing a waveform having a width just somewhat less than that of one half of the said A.C. sinusoidal current, and
(j) a zero crossing detector, for commencing operation of said second signal generator means at substantially the same time as the said zero crossing of the A.C. current occurs, (k) said second signal generator means producing a control voltage which inhibits conduction of the solid state device over a substantial portion of the half cycles of the A.C. current until just before they diminish toward zero, and then rendering the solid state device conductive for an interval of time corresponding to the last portion of the said half cycle until the zero crossing point, so as to produce a short pulse through the load, on successive half cycles, over periodic intervals determined by characteristics of the first mentioned signal generator means.

5. The invention as defined in claim 4, wherein:
   (a) said load comprises a capacitor, and
   (b) means periodically discharging the capacitor after it has been charged and after the A.C. current passes through zero and into its opposite half cycle.

6. Electrical circuit identification means for locating a particular one of a plurality of electrically-energized circuits leading to different accessible termination points in an electrical installation and originating at an energy distribution network that has means for opening said plurality of circuits and rendering the same dead, said circuits being normally energized and functioning, said means comprising, in combination:
   (a) an electrical load,
   (b) means for connecting said load to an accessible circuit termination point which is disposed remote from said distribution network, said termination point being part of a predetermined one of said circuits that is to be identified at said network, and said means providing current to said load from said predetermined one circuit,
   (c) a circuit control means activated and powered by current from said predetermined circuit, for periodically varying the current passing through said load, thereby to cause electrical current surges to flow in the predetermined circuit, and
   (d) an inductively-coupled indicator adapted to be magnetically linked to any of the leads of said plurality of electrical circuits at the said distribution network,
   (e) said indicator being adapted to respond to the surges in said predetermined circuit and to give an indication thereof, when magnetically coupled to the lead of said predetermined circuit at the distribution network,
   (f) said circuit control means comprising means for producing current pulses derived from the A.C. current and constituted as the trailing edges of adjacent half cycles thereof from a point on the wave approaching the zero crossover until the occurrence of said zero crossover.

7. Electrical circuit identification means for locating a particular one of a plurality of electrically-energized circuits leading to different accessible termination points in an electrical installation, and originating at an energy distribution network that has means for opening said plurality of circuits and rendering the same dead, said circuits being normally energized and functioning, said means comprising, in combination:
   (a) an electrical load,
   (b) means for connecting said load to an accessible circuit termination point which is disposed remote from said distribution network, said termination point being part of a predetermined one of said circuits that is to be identified at said network, and said means providing current to said load from said predetermined one circuit,
   (c) a circuit control means activated and powered by current from said predetermined circuit, for periodically varying the current passing through said load, thereby to cause electrical current surges to flow in the predetermined circuit, and
   (d) an inductively-coupled indicator adapted to be magnetically linked to any of the leads of said plurality of electrical circuits at the said distribution network,
   (e) said indicator being adapted to respond to the surges in said predetermined circuit and to give an indication thereof, when magnetically coupled to the lead of said predetermined circuit at the distribution network,
   (f) said electrical load comprising a capacitor,
   (g) said control means comprising a thyristor connected in series with said capacitor, and a timer for periodically rendering conductive the said thyristor.

8. The invention as defined in claim 7 wherein:
   (a) said capacitor is of the non-polarized type, and capable of being energized with continuous A.C. voltage, without incurring damage.

9. Electrical circuit identification means for locating a particular one of a plurality of electrically-energized circuits leading to different accessible termination points in an electrical installation, and originating at an energy distribution network that has means for opening said plurality of circuits and rendering the same dead, said circuits being normally energized and functioning, said means comprising, in combination:
   (a) an electrical load,
   (b) means for connecting said load to an accessible circuit termination point which is disposed remote from said distribution network, said termination point being part of a predetermined one of said circuits that is to be identified at said network, and said means providing current to said load from said predetermined one circuit,
   (c) a circuit control means activated and powered by current from said predetermined circuit, for periodically varying the current passing through said load, thereby to cause electrical current surges to flow in the predetermined circuit, and
   (d) an inductively-coupled indicator adapted to be magnetically linked to any of the leads of said plurality of electrical circuits at the said distribution network,
   (e) said indicator being adapted to respond to the surges in said predetermined circuit and to give an indication thereof, when magnetically coupled to the lead of said predetermined circuit at the distribution network,
   (f) said electrical load comprising a capacitor,
   (g) said control means comprising a solid state device connected in series with said capacitor, and a timer for periodically rendering at least partially conductive the said solid state device.

10. Electrical circuit identification means for locating a particular one of a plurality of electrically-energized circuits leading to different accessible termination points in an electrical installation, and originating at an energy distribution network that has means for opening said plurality of circuits and rendering the same dead, said circuits being normally energized and functioning, said means comprising, in combination:

(a) an electrical load, (b) means for connecting said load to an accessible circuit termination point which is disposed remote from said distribution network, said termination point being part of a predetermined one of said circuits that is to be identified at said network, and said means providing current to said load from said predetermined one circuit, (c) a circuit control means activated and powered by current from said predetermined circuit, for periodically varying the current passing through said load, thereby to cause electrical current surges to flow in the predetermined circuit, and (d) an inductively-coupled indicator adapted to be magnetically linked to any of the leads of said plurality of electrical circuits at the said distribution network, (e) said indicator being adapted to respond to the surges in predetermined circuit and to give an indication thereof, when magnetically coupled to the lead of said predetermined circuit at the distribution network, (f) a housing carrying and enclosing said electrical load, (g) heat sink means in good thermal, heat-transferring relation with said electrical load to conduct heat therefrom, (h) said circuit control means being disposed substantially completely within said housing so as to minimize the possibility of shock hazard to personnel handling the equipment.

11. The invention as defined in claim 10, wherein:

(a) said housing has an exposed metal wall, (b) said heat sink being in good thermal, heat-transferring relation with said exposed metal wall.

12. The invention as defined in claim 11, and further including:

(a) heat radiation means on the exposed metal wall of the housing.

13. The invention as defined in claim 12, wherein:

(a) the housing is constituted substantially of metal.

14. The invention as defined in claim 9, wherein:

(a) said capacitor is permanently connected to said circuit control means.

15. Electrical circuit identification means for locating a particular one of a plurality of electrically-energized circuits leading to different accessible termination points in an electrical installation and originating at an energy distribution network that has means for opening said plurality of circuits and rendering the same dead, said circuits being normally energized and functioning, said means comprising, in combination:

(a) an electrical load, (b) a supply control circuit having solid state control means for connecting said load to one such accessible circuit termination point which is disposed remote from said distribution network, said one termination point being a part of a predetermined one of said normally energized circuits that is to be identified at said distribution network and said supply control circuit being adapted to provide current to said load from said predetermined one normally energized circuit, (c) a signal generator having terminals (1, 8) for connection with said supply control circuit to receive energization therefrom, and having terminals (3, 8) for putting out a signal, (d) an output control circuit for connection with said second-mentioned terminals and for connection to said solid state control means, (e) coupling means connected between one of said control circuits and its respective terminals, to effect an isolation of said one control circuit from one of its respective terminals, (f) said signal generator causing a characteristic intermittent energization of said load and consequent characteristic surges in said predetermined one normally energized circuit, and (g) an inductively-coupled indicator adapted to be magnetically linked to any of said plurality of electrically energized circuits at the said distribution network, (h) said indicator being adapted to respond to the said characteristic surges in said predetermined normally energized circuit and to give an indication thereof, when magnetically coupled to said predetermined circuit at the distribution network.

16. The invention as set forth in claim 15, wherein:

(a) said supply control circuit comprises a rectifier and filter, for supplying d. c. voltage to the first mentioned terminals of the said signal generator.

17. The invention as set forth in claim 15, wherein:

(a) said electrical load comprises a capacitor in series with the solid state control means.

18. The invention as set forth in claim 17, wherein:

(a) said solid state control means and capacitor are in series with each other and connected across said supply control circuit.

19. The invention as set forth in claim 15, wherein:

(a) the signal generator terminals that are connected with the supply control circuit receive D.C. voltage therefrom, and one of said terminals is negative with respect to the other, (b) said negative terminal being at a different absolute voltage from either the ground side or the hot side of the electrically energized circuits.

* * * * *